United States Patent
Zuhoski et al.

(10) Patent No.: US 6,740,603 B2
(45) Date of Patent: May 25, 2004

(54) CONTROL OF VMIN TRANSIENT VOLTAGE DRIFT BY MAINTAINING A TEMPERATURE LESS THAN OR EQUAL TO 350° C. AFTER THE PROTECTIVE OVERCOAT LEVEL

(75) Inventors: Steven P. Zuhoski, Rowlett, TX (US); Mercer L. Brugler, Flower Mound, TX (US); Cameron Gross, Allen, TX (US); Edward L. Mickler, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 10/061,650

(22) Filed: Feb. 1, 2002

(65) Prior Publication Data

US 2002/0123247 A1 Sep. 5, 2002

Related U.S. Application Data

(60) Provisional application No. 60/265,792, filed on Feb. 1, 2001.

(51) Int. Cl.[7] .................. H01L 21/31; H01L 21/469
(52) U.S. Cl. ................... 438/791; 438/25; 438/26; 438/106; 438/116; 438/724; 257/298; 257/314; 257/681; 365/185.33
(58) Field of Search ................. 438/791, 25–26, 438/106, 116, 724, 744; 257/298–306, 681, 314; 365/185.33

(56) References Cited

U.S. PATENT DOCUMENTS

| | | | | | |
|---|---|---|---|---|---|
| 5,265,052 A | * | 11/1993 | D'Arrigo et al. | ...... | 365/189.09 |
| 5,394,013 A | | 2/1995 | Oku et al. | | |
| 5,557,124 A | * | 9/1996 | Roy et al. | ...... | 257/316 |
| 5,634,050 A | * | 5/1997 | Kraeger et al. | ...... | 395/616 |
| 5,650,970 A | * | 7/1997 | Kai | ...... | 365/203 |
| 5,661,685 A | * | 8/1997 | Lee et al. | ...... | 365/185.22 |
| 5,744,752 A | * | 4/1998 | McHerron et al. | ...... | 174/52.4 |
| 5,821,620 A | * | 10/1998 | Hong | ...... | 257/751 |
| 5,888,870 A | * | 3/1999 | Gardner et al. | ...... | 438/261 |
| 6,001,697 A | * | 12/1999 | Chang et al. | ...... | 438/299 |
| 6,008,120 A | * | 12/1999 | Lee | ...... | 438/634 |
| 6,038,636 A | * | 3/2000 | Brown, III et al. | ...... | 711/103 |
| 6,150,920 A | * | 11/2000 | Hashimoto et al. | ...... | 338/309 |

(List continued on next page.)

FOREIGN PATENT DOCUMENTS

| | | |
|---|---|---|
| EP | 0-810614a1 | 5/1997 |
| WO | WO 9419829 | 9/1994 |

OTHER PUBLICATIONS

Onishi et al. "A half–micron ferroelectric memory cell technology with stacked capacitor structure" IEDM 94–843 0–7803–2111 1994 IEEE p.. 34.4.1–34.4.4.*

Sidharth et al. "Characterization of a novel fine–pitch ball grid array pachage for flash memory application" Electronic components and technology conference 0–7803–5908–9/00 p. 353–357.*

Primary Examiner—Matthew Smith
Assistant Examiner—Granvill D Lee
(74) Attorney, Agent, or Firm—Jacqueline J. Garner; W. James Brady, III; Frederick J. Telecky, Jr.

(57) ABSTRACT

A method for fabricating a non-FLASH integrated circuit that minimizes Vmin shift. A protective overcoat (134) is deposited to protect and encapsulate the top metal interconnect layer (118). The protective overcoat (134) is patterned and etched to form bondpad windows either before or after depositing the final metal interconnect layer (136). A sinter that is normally performed after forming the bondpad windows is either omitted or the temperature of the sinter is kept at or below 350° C.

10 Claims, 2 Drawing Sheets

U.S. PATENT DOCUMENTS

| | | | |
|---|---|---|---|
| 6,195,229 B1 * | 2/2001 | Shen et al. ................. | 360/113 |
| 6,211,035 B1 * | 4/2001 | Moise et al. ................ | 438/396 |
| 6,255,586 B1 | 7/2001 | Kim et al. | |
| 6,268,642 B1 | 7/2001 | Hsuan et al. | |
| 6,355,524 B1 * | 3/2002 | Tuan et al. ................ | 438/257 |
| 6,410,363 B1 * | 6/2002 | Tani et al. .................. | 438/112 |
| 6,415,973 B1 | 7/2002 | Ho et al. | |
| 2001/0044186 A1 | 11/2001 | Reinberg | |
| 2002/0123214 A1 | 9/2002 | Zuhoski et al. | |
| 2002/0123225 A1 | 9/2002 | Zuhoski et al. | |

* cited by examiner

CONTROL OF VMIN TRANSIENT VOLTAGE DRIFT BY MAINTAINING A TEMPERATURE LESS THAN OR EQUAL TO 350° C. AFTER THE PROTECTIVE OVERCOAT LEVEL

This application claims priority under 35 USC § 119(e)(1) of provisional application No. 60/265,792 filed Feb. 1, 2001.

FIELD OF THE INVENTION

The invention is generally related to the field of forming semiconductor devices and more specifically to forming the protective overcoat on semiconductor devices.

BACKGROUND OF THE INVENTION

In fabricating an integrated circuit, bondpads are formed in the final metal interconnect layer. This can be accomplished with at least two different methods. In the first method the final metal interconnect layer is deposited. After which, a protective overcoat is formed. Bondpad windows are then patterned and etched into the protective overcoat. In the second method, the protective overcoat is first formed. The bondpad windows are patterned and etched into the protective overcoat. The final metal layer interconnect is then deposited to fill the bondpad windows. A final pattern and etch is accomplished to remove the remaining excess metal. Traditionally, silicon-nitride is used in the protective overcoat with an underlying oxide layer. Silicon-nitride is deposited using $SiH_4$ and $NH_3$. Common to these methods of depositing and forming the final metal layer interconnect and protective overcoat is a sinter performed at 435° C. in $H_2/N_2$ for 30 minutes. This sinter is always performed after the completion of the steps described above.

There are many types of integrated circuits. There are logic ICs, DRAMs (dynamic random access memories), SRAMs (static random access memories), analog ICs, digital signal processors, mixed signal processors, etc. There are also special integrated circuits referred to as FLASH devices or FLASH memories. FLASH devices are UV (ultra-violet light) programmable. FLASH devices require a protective overcoat that is UV transmissive. For this reason, silicon-oxynitride may be used as a protective overcoat for FLASH devices.

DETAILED DESCRIPTION OF THE EMBODIMENTS

After fabrication of many integrated circuits, qualification testing is performed. One qualification test is a high voltage/high temperature operating test or (HTOL, burn-in). During burn-in testing of a particular 1.5V device, a drift in the Vmin was discovered. Vmin is the minimum voltage (with maximum frequency) at which the addressed circuit functions correctly. The Vmin shift was observed to be in excess of 100 mV.

After further evaluation of the device, the cause of the Vmin shift was isolated to the protective overcoat deposition/etch process loop. The inventors believe the Vmin shift to be caused by the outdiffusion of hydrogen from the protective overcoat film by thermal activation. The outdiffusion of hydrogen is believed to degrade the gate oxide thus causing the Vmin shift. Since silicon-nitride was used in the protective overcoat, hydrogen is available through the use of process gases $SiH_4$ and $NH_3$ used to form the silicon-nitride. The post deposition hydrogen sinter provides the thermal activation.

The embodiments of the invention reduce the outdiffusion of hydrogen from the protective overcoat at elevated temperatures. One embodiment removes the post PO deposition hydrogen sinter altogether and another embodiment limits the thermal budget to less than or equal to 350° C. for all post PO deposition processes including the post PO deposition hydrogen sinter.

The embodiments of the invention will now be described in conjunction with a non-UV programmable (i.e., non-FLASH) integrated circuit. It will be apparent to those of ordinary skill in the art that the invention may be applied to other non-UV programmable integrated circuits than that shown.

Figure 1:
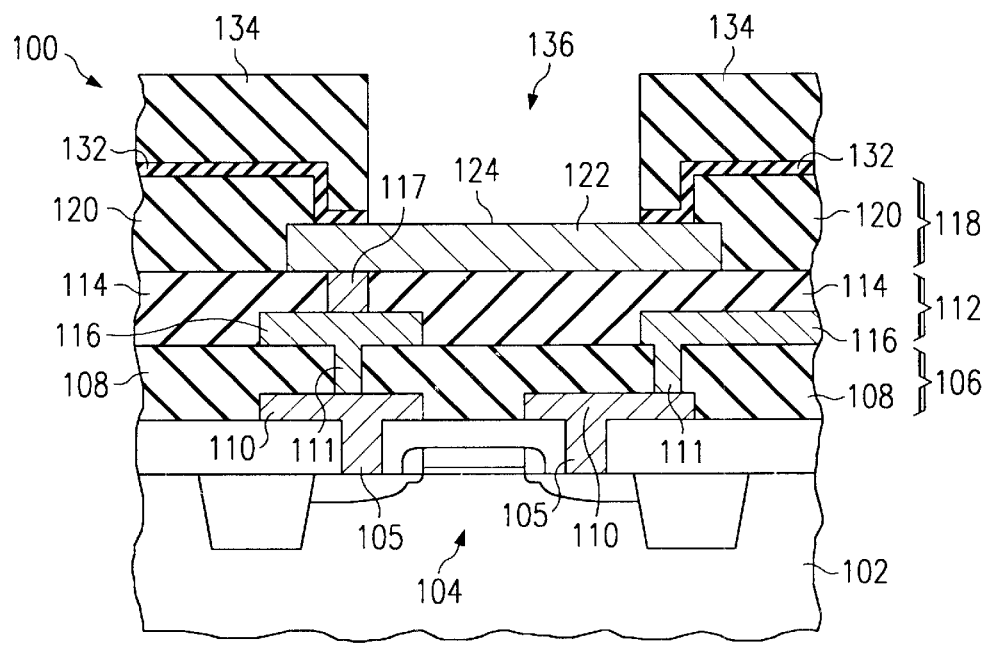
FIG. 1 is a cross-sectional diagram of an integrated circuit having a protective overcoat formed according to the invention.

A portion of a semiconductor device 100 formed according to an embodiment of the invention is shown in FIG. 1. Integrated circuit 100 comprises a semiconductor substrate 102. Semiconductor substrate 102 typically comprises silicon although other semiconductors may alternatively be used. Substrate 102 may or may not also include epitaxial layer formed thereon. Transistors 104 are formed at the surface of substrate 102. Metal interconnect levels 106, 112, 118 are formed over the surface of the substrate. While three interconnect levels are shown, the number of interconnect levels varies depending on the application. Typically, between 2 and 6 levels of metal are used. Each metal interconnect level comprises a dielectric (108, 114, and 120) and a metal (110, 116, 122). The metal is typically either predominantly aluminum or copper and includes barrier layers such as refractory metals and/or their nitrides. Contacts 105 make electrical connection between the first metal 110 and the transistors 104. Vias 111 and 117 make electrical connection between the metal interconnect levels.

The top metal interconnect level (shown here as 118) comprises larger areas of metal referred to as bondpads 124. Bondpads 124 are used to make connection to the semiconductor device 100 during, for example, packaging.

An etchstop layer of silicon nitride may be deposited over the top metal interconnect level if desired. Silicon nitride is useful where copper is used for the metal interconnects in order to encapsulate the copper and prevent diffusion of the copper into the overlying dielectrics.

A protective overcoat is formed to protect and encapsulate the top metal interconnect layer 118 (and silicon nitride if present). Several layers may in fact form the protective overcoat. The additional layers are useful in accomplishing laser repair. To accomplish laser repair, at least a portion of the bondpads 124 are exposed. The functionality of the device is tested and any needed redundant circuits are identified. The first protective overcoat layer 132 is optionally deposited. Its function is to protect bondpads 124 while fuses are blown using a laser to activate redundant circuitry as needed. First protective-overcoat layer 132 comprises an oxide. For example, a PECVD (plasma-enhanced chemical vapor deposition) silicon-dioxide may be deposited. The thickness of first protective overcoat layer 132 may be on the order of 3000 Å. After the desired fuses are blown, a slag etch/clean is performed to remove unwanted material resulting from the laser repair process.

The second/main protective overcoat layer 134 comprises silicon-nitride or silicon-oxynitride. The thickness of the second protective overcoat layer 134 may be on the order of 8000 Å. PECVD may be used to deposit second protective overcoat layer 134.

Figure 2:
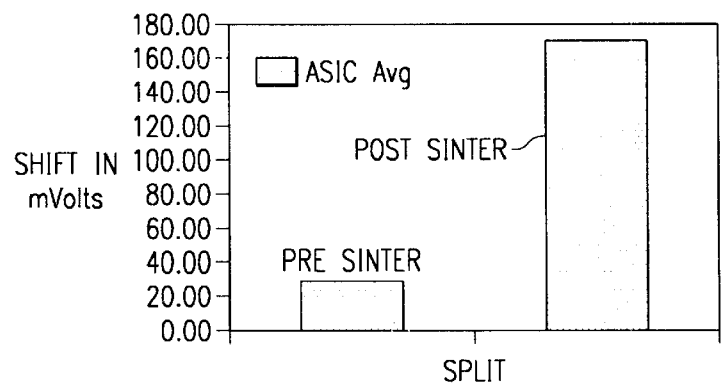
FIG. 2 is a graph of Vmin shift for a pre-sinter and post-sinter condition.
Figure 3:
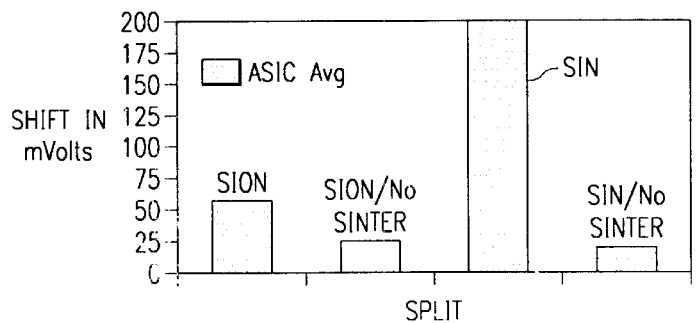
FIG. 3 is a graph of Vmin shift for four conditions: SiON, SiON without sinter, SiN, and SiN without sinter.
Figure 4:
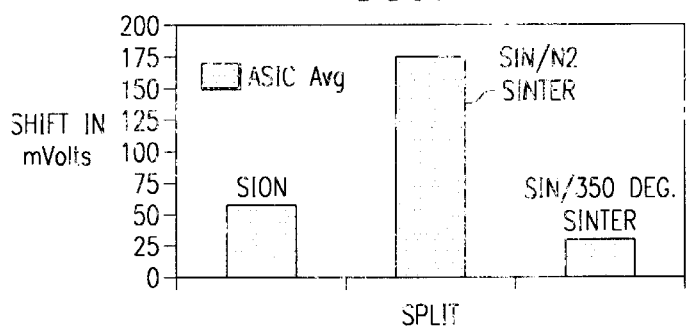
FIG. 4 is a graph that shows the effects of a SiN with $N_2$ sinter and SiN with a 350° C. sinter compared to a SiON.
Figure 5:
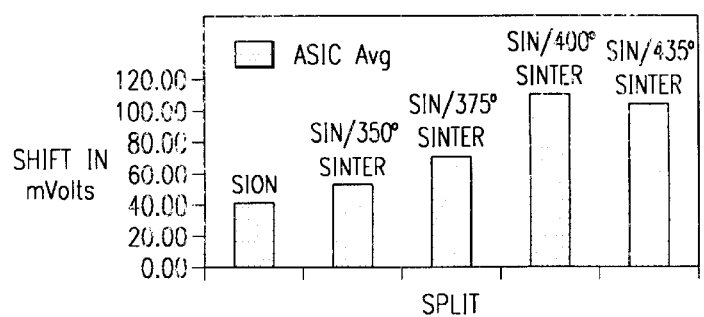
FIG. 5 is a graph that shows the Vmin shift for SiN with various temperature sinters compared to SiON.

The protective overcoat layers 134 and 132 are patterned and etched to open bondpad windows 136. If desired, instead of forming the top metal interconnect prior to depositing the protective overcoat layers, the top metal interconnect may be formed after the bondpad windows 136 are opened. In that case, after opening the bondpad windows, metal (along with any desired barriers) is deposited. Excess metal is then removed. Finally, a sinter may be performed prior to packaging. The temperature of the sinter (and all other processes between PO pattern and etch and packaging) is kept at or below 350° C. For example, a sinter in hydrogen at 350° C. for 30 minutes may be used. Alternatively, the sinter may be removed entirely. In that case, no sinter is performed between PO deposition and packaging. FIG. 2 is a graph of Vmin shift for a pre-sinter and post-sinter condition. FIG. 3 is a graph of Vmin shift for four conditions: SiON, SiON without sinter, SiN, and SiN without sinter. Removing the sinter from the SiN case in one lot improved the Vmin shift from in excess of 100 mV to approximately 20 mV. Removing the sinter from the SiON case in one lot improved the Vmin shift from approximately 55 mV to approximately 25 mV. FIG. 4 shows the effects of a SiN with $N_2$ sinter and SiN with a 350° C. sinter compared to a SiON. The 350° C. reduced the Vmin shift to approximately 30 while still using SiN. FIG. 5 shows the Vmin shift for SiN with various temperature sinters compared to SiON. From these figures, it is apparent that temperature is the overriding contributor to the Vmin shift.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

In the claims:

1. A method for fabricating a non-FLASH integrated circuit, comprising the steps of:

providing a semiconductor body;

forming a top metal interconnect layer over the semiconductor body;

depositing a protective overcoat accompanying said top metal interconnect layer;

patterning and etching said protective overcoat to form bondpad windows in said protective overcoat; and thereafter, packaging the non-FLASH integrated circuit wherein a temperature of the semiconductor body is kept at or below 350° C. between said patterning and etching step and said packaging step.

2. The method of claim 1, wherein said patterning and etching step is performed prior to forming the top metal interconnect layer.

3. The method of claim 1, wherein said patterning and etching step is performed after forming the top metal interconnect layer.

4. The method of claim 1, further comprising the steps of:

performing a sinter after said patterning and etching step and prior to said packaging step wherein a temperature of said sinter is kept at or below 350° C.

5. The method of claim 1, wherein no sintering steps are performed between said patterning and etching step and said packaging step.

6. The method of claim 1, wherein said protective overcoat comprises silicon nitride.

7. The method of claim 1, wherein said protective overcoat comprises silicon oxynitride.

8. A method for fabricating a non-FLASH integrated circuit, comprising the steps of:

providing a semiconductor body;

forming a top metal interconnect layer over the semiconductor body;

depositing a protective overcoat accompanying said top metal interconnect layer;

patterning and etching said protective overcoat to form bondpad windows in said protective overcoat;

thereafter, performing a sinter in hydrogen at a temperature at or below 350° C.; and thereafter, packaging the non-FLASH integrated circuit.

9. The method of claim 8, wherein said patterning and etching step is performed prior to forming the top metal interconnect layer.

10. The method of claim 8, wherein said patterning and etching step is performed after forming the top metal interconnect layer.

* * * * *